United States Patent
Sunaga

(10) Patent No.: US 9,471,112 B2
(45) Date of Patent: Oct. 18, 2016

(54) COMMUNICATION MODULE

(71) Applicant: Hitachi Metals, Ltd., Minato-ku, Tokyo (JP)

(72) Inventor: Yoshinori Sunaga, Hitachinaka (JP)

(73) Assignee: Hitachi Metals, Ltd., Tokyo (JP)

( * ) Notice: Subject to any disclaimer, the term of this patent is extended or adjusted under 35 U.S.C. 154(b) by 1 day.

(21) Appl. No.: 14/715,819

(22) Filed: May 19, 2015

(65) Prior Publication Data

US 2015/0373862 A1   Dec. 24, 2015

(30) Foreign Application Priority Data

Jun. 24, 2014   (JP) .................................. 2014-129711

(51) Int. Cl.
*G06F 1/18* (2006.01)
*H05K 7/14* (2006.01)

(52) U.S. Cl.
CPC .............. *G06F 1/18* (2013.01); *H05K 7/1452* (2013.01)

(58) Field of Classification Search
CPC .... G06F 1/18; H05K 7/1452; H05K 5/0069; H05K 5/0221; H05K 5/0286; H05K 5/0021; H05K 5/0208; H05K 7/1409; H05K 7/1414
USPC .................................................. 361/728–747
See application file for complete search history.

(56) References Cited

U.S. PATENT DOCUMENTS

| | | | | |
|---|---|---|---|---|
| 6,632,023 B1 * | 10/2003 | Ogawa | ................ | G02B 6/3825 385/53 |
| 7,416,433 B1 * | 8/2008 | Wu | .................... | G02B 6/4246 439/160 |
| 2006/0238923 A1 * | 10/2006 | Chen | .................. | G11B 5/4846 360/245.8 |
| 2007/0066141 A1 * | 3/2007 | Zhu | ..................... | H01R 12/727 439/607.27 |
| 2010/0091466 A1 * | 4/2010 | Wu | ....................... | G06K 13/08 361/747 |
| 2010/0285682 A1 * | 11/2010 | Wu | .................... | H01R 13/6275 439/357 |
| 2014/0153195 A1 * | 6/2014 | You | ..................... | G02B 6/4261 361/728 |
| 2016/0029499 A1 * | 1/2016 | Sunaga | ............. | H05K 7/20254 361/759 |
| 2016/0126647 A1 * | 5/2016 | Sunaga | ............. | H01R 12/7076 439/76.1 |

FOREIGN PATENT DOCUMENTS

JP         2007-13102 A      1/2007

* cited by examiner

*Primary Examiner* — Anthony Haughton
*Assistant Examiner* — Yahya Ahmad
(74) *Attorney, Agent, or Firm* — Crowell & Moring LLP

(57) ABSTRACT

A communication module including a latching protrusion and an operating unit for operating the latching protrusion and easily accessing the operating unit even in the case of high-density mounting is achieved. The communication module includes a case including a plug connector which is inserted into/pulled out from a receptacle connector provided on a motherboard, a latching protrusion which has a variable protrusion length from the case and which can be latched with and unlatched from a latching hole provided on the motherboard, and an operating unit which moves the latching protrusion toward inside of the case to unlatch the latching protrusion from the latching hole. An operating direction of the operating unit is a direction (X direction) orthogonal to both of an arranging direction of the communication module and other communication module adjacent thereto and an inserting/pulling-out direction of the plug connector.

6 Claims, 7 Drawing Sheets

COMMUNICATION MODULE

CROSS-REFERENCE TO RELATED APPLICATION

The present application claims priority from Japanese Patent Application No. 2014-129711 filed on Jun. 24, 2014, the content of which is hereby incorporated by reference into this application.

TECHNICAL FIELD OF THE INVENTION

The present invention relates to a communication module used in signal transmission between electronic devices and signal transmission inside an electronic device.

BACKGROUND OF THE INVENTION

The amount of information handled between electronic devices and the amount of information handled inside an electronic device have increased year by year. With this increase in the amount of information, the number of communication modules to be mounted on the electronic device has also increased, and therefore, it is desired to mount a plurality of communication modules with high density.

Here, a communication module and an electronic device having the communication module mounted thereon may be provided with latching means for fixing the communication module and the electronic device. For example, a substrate (motherboard) of the electronic device is provided with a slot having a latching hole formed therein. Meanwhile, the communication module is provided with a latching protrusion which can be latched with and unlatched from a latching hole formed in the slot included in the electronic device, and an operating unit for operating the latching protrusion. When the communication module is inserted into the slot of the electronic device, the latching protrusion protruding from a case of the communication module is latched with the latching hole formed in the slot. On the other hand, the latching protrusion latched with the latching hole is retracted into the case by the operation of the operating unit so as to be unlatched from the latching hole.

PRIOR ART DOCUMENT

Patent Document

Patent Document 1: Japanese Patent Application Laid-Open Publication No. 2007-13102

SUMMARY OF THE INVENTION

When a plurality of communication modules are mounted with high density, a gap between adjacent communication modules is narrowed, and therefore, there is a risk of impossibility or difficulty in accessing the operating unit provided to each communication module. More particularly, when the operating direction of the operating unit provided to each communication module is parallel to the arranging direction of the communication modules while the plurality of communication modules are arranged with a narrow pitch in parallel to each other, there is a risk of not only the impossibility or difficulty in accessing the operating unit but also impossibility or difficulty in ensuring an operating amount (stroke) of the operating unit.

An object of the present invention is to provide a communication module including a latching protrusion and an operating unit for operating the latching protrusion and being capable of easily accessing the operating unit even in the case of high-density mounting.

The communication module of the present invention is mounted on a substrate together with a plurality of other communication modules. The communication module of the present invention has: a case including a second connector which is inserted to/pulled out from a first connector provided on the substrate; a latching protrusion which has a variable protrusion length from the case and which can be latched with and unlatched from a latching unit provided on the substrate; an elastic member which presses the latching protrusion toward outside of the case so as to maintain a state in which the latching protrusion is latched with the latching unit; and an operating unit which moves the latching protrusion into the case against the pressing of the elastic member so as to unlatch the latching protrusion from the latching unit. An operating direction of the operating unit is a direction orthogonal to both of an arranging direction of the communication module and another communication module adjacent thereto and an inserting/pulling-out direction of the first connector.

In an aspect of the present invention, a pair of the latching protrusions and a pair of the operating units are provided. When the pair of operating units approach each other along the operating direction, each of the pair of latching protrusions moves into the case along the operating direction.

In another aspect of the present invention, the pair of operating units protrude from a top surface of the case which faces a bottom surface of the case provided with the second connector. Also, one of the pair of latching protrusions moves inside/outside the case through an opening part formed on a first side surface of the case, and the other of the pair of latching protrusions moves inside/outside the case through an opening part formed on a second side surface of the case which faces the first side surface.

In still another aspect of the present invention, the communication module is inserted into/pulled out from a slot which is provided on the substrate and which includes the first connector, and the latching unit is provided in periphery of an opening part of the slot.

In still another aspect of the present invention, the slot is formed of a part of a heat sink mounted on the substrate, and the heat sink is overlapped and mounted on a communication semiconductor chip mounted on the substrate and is thermally connected to the communication semiconductor chip.

In still another aspect of the present invention, the operating direction of the operating unit is in parallel to a protruding direction of the latching protrusion.

According to the present invention, a communication module which includes a latching protrusion and an operating unit for operating the latching protrusion and which can easily access the operating unit even in the case of high-density mounting is achieved.

BRIEF DESCRIPTIONS OF THE DRAWINGS

DESCRIPTIONS OF THE PREFERRED EMBODIMENTS

Figure 1:
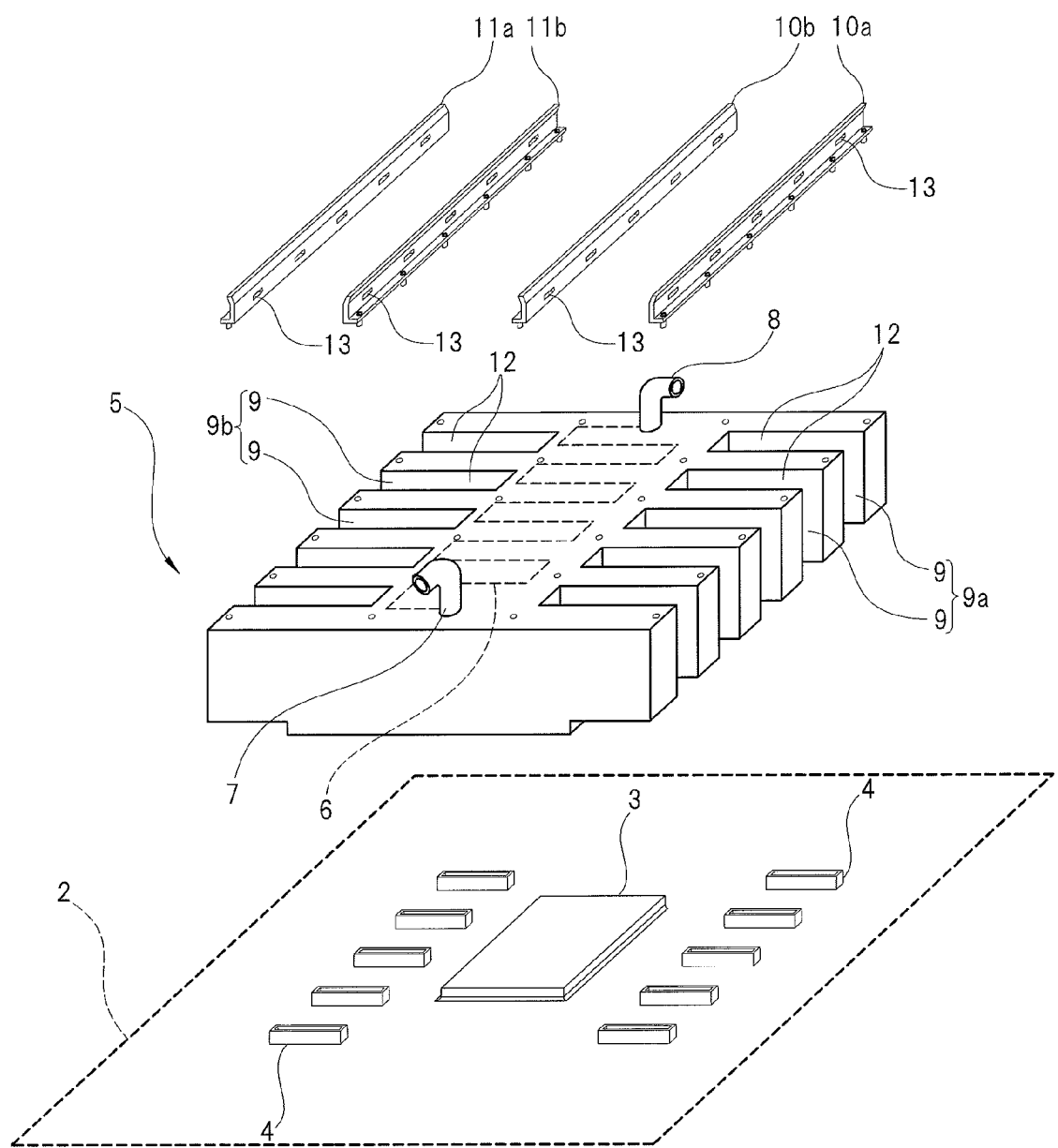
FIG. 1 is an exploded perspective view showing an example of a structure of an electronic device having a communication module mounted thereon to which the present invention is applied.

An example of embodiments of the communication module of the present invention will be described below. The communication module according to the present embodiment is mounted on an electronic device not shown in the drawing, together with a plurality of other communication modules. Specifically, the communication module according to the present embodiment and other communication modules are each inserted into a slot provided on a substrate (motherboard) included in the electronic device, and is connected to a connector included in the slot. Thus, the structure of the electronic device will be described first, and then, the structure of the communication module according to the present embodiment will be described. Note that the communication module according to the present embodiment and the other communication modules having the same shape and structure as those of the communication module are mounted on the motherboard of the electronic device with high density. However, in the drawings attached to the present specification, the illustration of the other communication modules is omitted.

As shown in FIG. 1, a communication semiconductor chip 3 is mounted substantially at the center of a motherboard 2 included in the electronic device. Also, a plurality of first connectors (receptacle connectors 4) are arranged in periphery of the communication semiconductor chip 3. Each of the receptacle connectors 4 is electrically connected to the communication semiconductor chip 3 via a wire, although not shown, formed on the motherboard 2.

Furthermore, a heat sink 5 is overlapped and mounted on the communication semiconductor chip 3 mounted on the motherboard 2, and the top surface of the communication semiconductor chip 3 and the bottom surface of the heat sink 5 are in contact with each other via a thermally conductive sheet not shown. That is, the communication semiconductor chip 3 and the heat sink 5 are thermally connected to each other. A refrigerant passage 6 winding in a zigzag manner is formed inside the heat sink 5, one end of the refrigerant passage 6 communicates with a connection plug 7 formed on the top surface of the heat sink 5, and the other end of the refrigerant passage 6 communicates with another connection plug 8 formed on the top surface of the heat sink 5. A refrigerant supply pipe not shown is connected to the one connection plug 7, and a refrigerant collection pipe not shown is connected to the other connection plug 8. By a pump embedded in the electronic device although not shown, the refrigerant (for example, water) is supplied to the heat sink 5 via the refrigerant supply pipe and the connection plug 7. The refrigerant supplied to the heat sink 5 passes through the refrigerant passage 6, and is collected in the pump via the connection plug 8 and the refrigerant collection pipe. That is, the refrigerant is circulated in the heat sink 5.

Two facing sides of the heat sink 5 are formed in a comb shape so as to avoid the receptacle connectors 4. Specifically, a plurality of slits 9 are formed on one side of the heat sink 5 along the one side, and a plurality of slits 9 are formed on another side of the heat sink 5 along the another side. When the heat sink 5 is mounted at a predetermined position on the motherboard 2, each receptacle connector 4 is accommodated inside a predetermined slit 9. That is, while the communication semiconductor chip 3 is covered with the heat sink 5, the receptacle connectors 4 are not covered with the heat sink 5. In other words, a plurality of slots including the receptacle connectors 4 are formed on the motherboard 2. Accordingly, in the following description, each slit 9 formed in the heat sink 5 may be referred to as a "slot 9". Also, the plurality of slots 9 formed on the right side of the heat sink 5 in FIG. 1 may be collectively referred to as a "right slot line 9a" and the plurality of slots 9 formed on the left side of the heat sink 5 may be collectively referred to as a "left slot line 9b".

Figure 2:
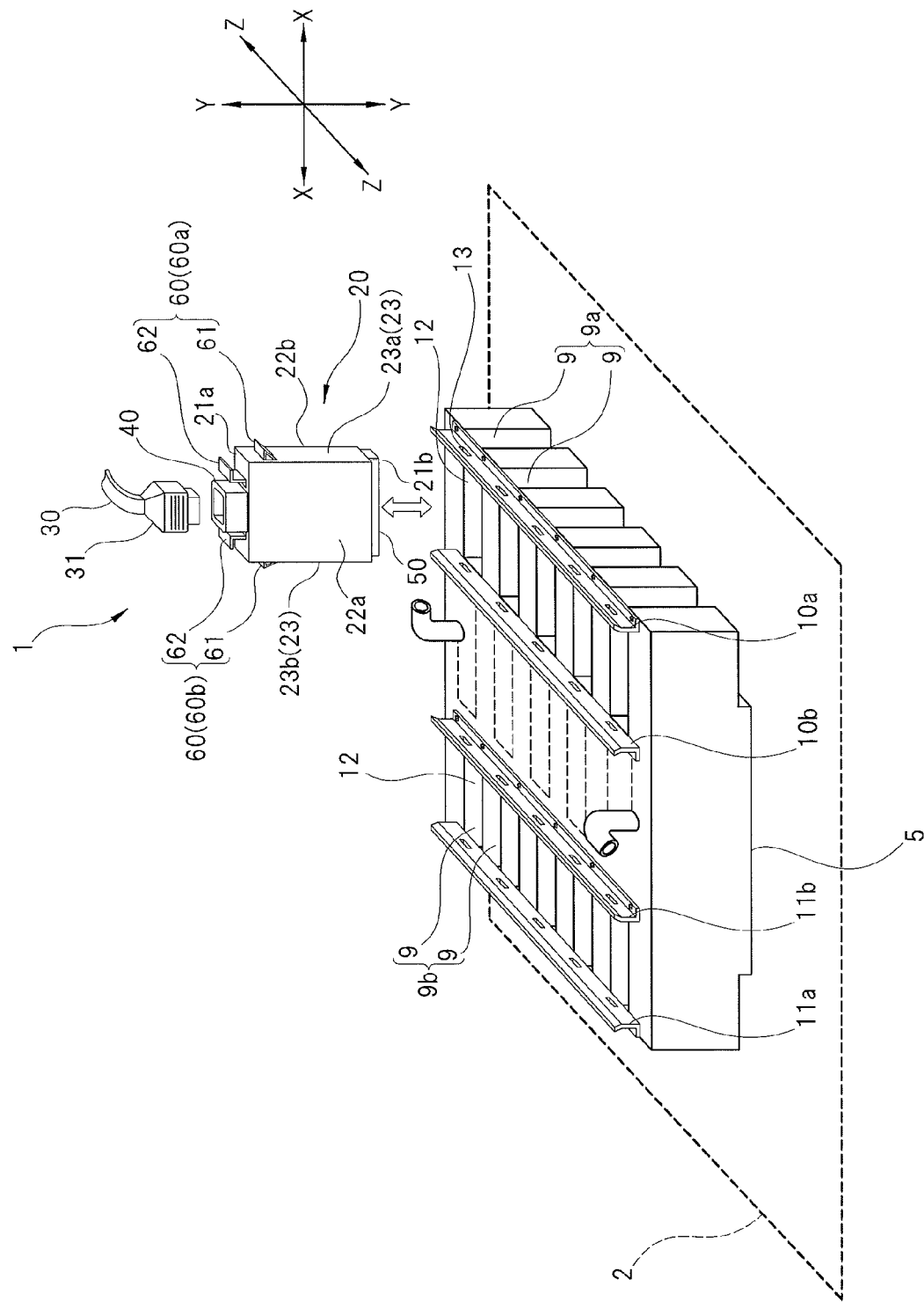
FIG. 2 is a perspective view showing an example of the communication module to which the present invention is applied.

On the top surface of the heat sink 5, a pair of angle members 10a and 10b and another pair of angle members 11a and 11b are arranged. Each of the angle members 10a, 10b, 11a, and 11b is made of metal such as aluminum or stainless, and is screwed onto the top surface of the heat sink 5. Specifically, as shown in FIG. 2, the pair of angle members 10a and 10b are screwed onto both sides of the right slot line 9a, and another pair of angle members 11a and 11b are screwed onto both sides of the left slot line 9b. In other words, the pair of angle members 10a and 10b face each other across an opening part 12 of each slot 9 included in the right slot line 9a, and another pair of angle members 11a and 11b face each other across an opening part 12 of each slot 9 included in the left slot line 9b.

In each of the angle members 10a, 10b, 11a, and 11b, a plurality of latching holes 13 are formed along a longitudinal direction of the angle members, and these latching holes 13 are arranged with the same pitch as those of the slots 9. That is, each latching hole 13 as a latching unit is provided in periphery of the opening part 12 of each slot 9 (in the present embodiment, on both sides of the opening part 12).

Next, the communication module according to the present embodiment will be described in detail. As shown in FIG. 2, a communication module 1 is inserted to/pulled out from the slot 9 through the opening part 12 of each slot 9 formed of a part of the heat sink 5.

The communication module 1 has a case 20 formed substantially in a rectangular parallelepiped shape and made of a sheet metal. The case 20 of the communication module 1 has a top surface 21a and a bottom surface 21b facing each other, a front surface 22a and a back surface 22b facing each other, and a first side surface 23a and a second side surface 23b facing each other. In the following description, the first side surface 23a and the second side surface 23b may be collectively referred to as a "side surface 23". Also, a facing direction of the top surface 21a and the bottom surface 21b is defined as a "height direction", a facing direction of the first side surface 23a and the second side surface 23b is defined as a "width direction", and a facing direction of the front surface 22a and the back surface 22b is defined as a "thickness direction". According to these definitions, the communication module 1 is a thin module with the dimension in the thickness direction smaller than the dimensions in the height direction and the width direction.

The case 20 of the communication module 1 is provided with an optical connecting unit 40 to which an optical connector 31 mounted at an end of an optical fiber cable 30 is to be connected. Furthermore, the case 20 is provided with a second connector (a plug connector 50) to be inserted into/pulled out from the receptacle connector 4 (FIG. 1), a pair of latching protrusions 61 each of which has a variable protrusion length from the case 20, and a pair of operating units 62.

Figure 3:
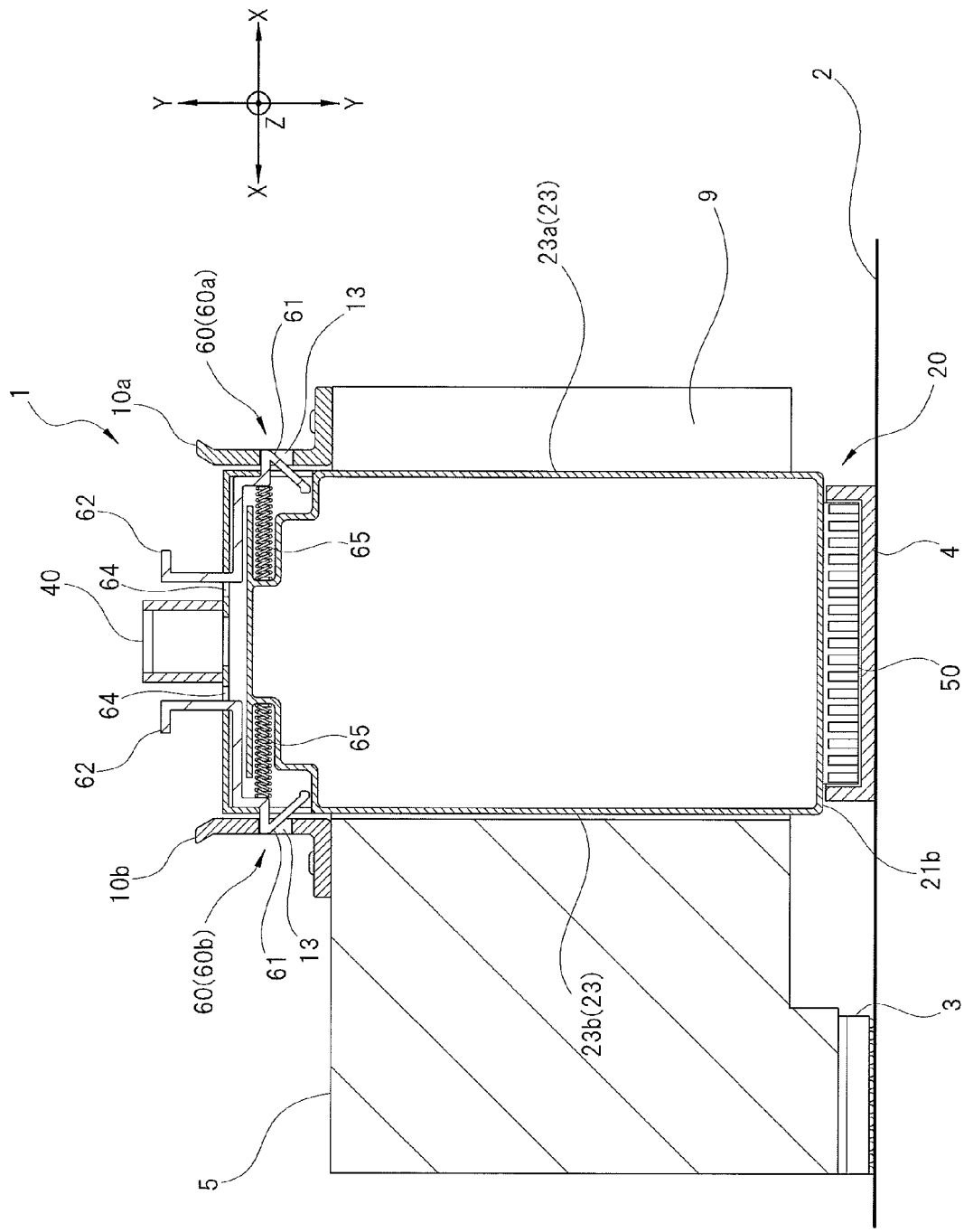
FIG. 3 is an enlarged cross-sectional view of the communication module shown in FIG. 2.

As shown in FIG. 3, the plug connector 50 is an edge connector (card edge) protruding from the bottom surface 21b of the case 20. On the other hand, the optical connecting unit 40 protrudes from the top surface 21a of the case 20 facing the bottom surface 21b. Also, one of the latching protrusions 61 protrudes from the first side surface 23a of the case 20, and the other of the latching protrusions 61 protrudes from the second side surface 23b of the case 20 facing the first side surface 23a. Furthermore, the pair of operating units 62 and 62 protrude from the top surface 21a of the case 20, and face each other across the optical connecting unit 40. Note that various elements required for achieving an optical communication function and other functions are accommodated inside the case 20 although not shown in FIG. 3. For example, at least a light-emitting element and a driving element for driving the light-emitting element are accommodated inside the case 20.

Figure 4:
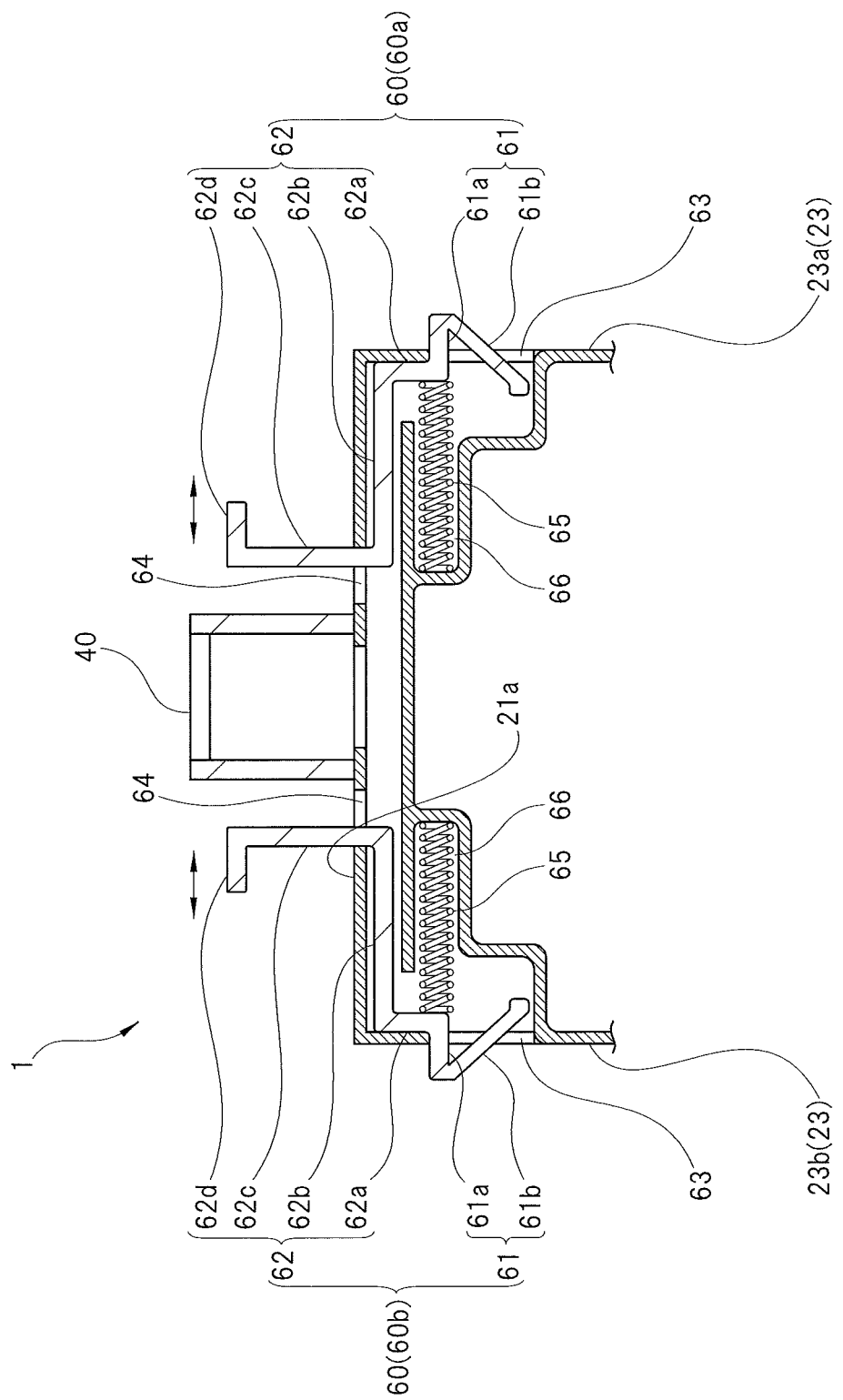
FIG. 4 is a partially-enlarged cross-sectional view of the communication module shown in FIG. 2.

As shown in FIG. 4, each latching protrusion 61 includes a horizontal part 61a in parallel to the top surface 21a of the case 20 and a tilted part 61b extending diagonally downward from the tip of the horizontal part 61a toward the inside of the case 20. On the other hand, each operating unit 62 includes: a first vertical part 62a which stands up along the side surface 23 of the case 20 from a rear end of the horizontal part 61a of the latching protrusion 61; a coupling part 62b which extends in parallel to the top surface 21a of the case 20 from an end of the first vertical part 62a; a second vertical part 62c which stands up along the side surface 23 of the case 20 from an end of the coupling part 62b; and a pinching part 62d which extends in parallel to the top surface 21a of the case 20 from an end of the second vertical part 62c. Incidentally, the latching protrusion 61 (the horizontal part 61a and the tilted part 61b) and the operating unit 62 (the first vertical part 62a, the coupling part 62b, the second vertical part 62c, and the pinching part 62d) are integrally molded. Thus, in the following description, the latching protrusion 61 and the operating unit 62 may be collectively referred to as a "latching member 60". Meanwhile, for convenience of description, the latching member 60 shown on the right side of the sheet in FIG. 3 and FIG. 4 may be referred to as a "right latching member 60a", and the latching member 60 shown on the left side of the sheet may be referred to as a "left latching member 60b" for distinction.

As shown in FIG. 4, the latching protrusion 61 of the right latching member 60a protrudes from an opening part 63 formed in the first side surface 23a to the outside of the case 20, and the latching protrusion 61 of the left latching member 60b protrudes from an opening part 63 formed in the second side surface 23b to the outside of the case 20. On the other hand, each of the operating units 62 protrudes upward from the opening part 64 formed in the top surface 21a of the case 20.

As described above, the communication module 1 according to the present embodiment includes the pair of latching members 60 (the right latching member 60a and the left latching member 60b), and each latching member 60 is a single member including the latching protrusion 61 and the operating unit 62. Note that the latching member 60 in the present embodiment is made of a resin material. However, the latching member 60 can be made of also another material such as a sheet metal.

As shown in FIG. 4, an accommodating unit 66 in which a coil spring 65 as an elastic member is accommodated is provided inside the case 20. One end of the coil spring 65 accommodated in the accommodating unit 66 abuts on the inner surface of the accommodating unit 66, and another end of the coil spring 65 abuts on the first vertical part 62a of the operating unit 62. That is, the coil spring 65 is accommodated in a compressed state between the inner surface of the accommodating unit 66 and the inner surface of the first vertical part 62 facing each other. Thus, the right latching member 60a shown in FIG. 4 is always pressed in a right direction by the coil spring 65 located at the back thereof, and the left latching member 60b is always pressed in a left direction by the coil spring 65 located at the back thereof. In other words, each latching member 60 is always pressed by the coil spring 65 toward the outside of the case 20. Incidentally, since the operating unit 62 (the first vertical part 62a) of each latching member 60 abuts on the inner surface of the case 20, the right latching member 60a does not move rightward further than the position shown in FIG. 3 and FIG. 4, and the left latching member 60b does not move leftward further than the position shown in FIG. 3 and FIG. 4. That is, the position shown in FIG. 3 and FIG. 4 is an initial position of the latching member 60. When the right latching member 60a and the left latching member 60b are each at the initial position, the protrusion length of each latching protrusion 61 from the case side surface 23 becomes the longest, and a gap between the right latching member 60a and the left latching member 60b is maximized.

Figure 5:
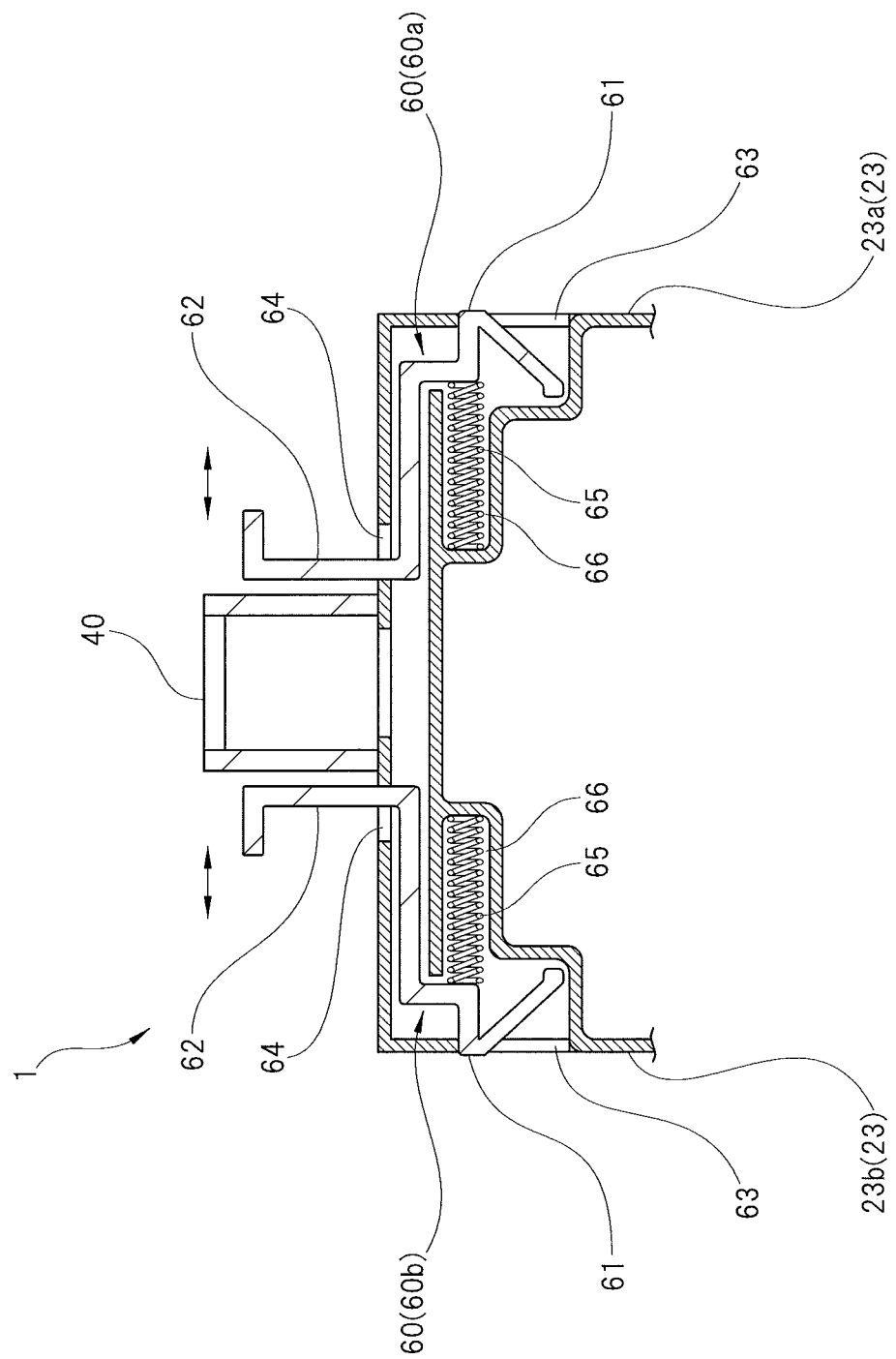
FIG. 5 is another partially-enlarged cross-sectional view of the communication module shown in FIG. 2.

On the other hand, when the operating units 62 are operated, each latching member 60 moves toward the inside of the case 20 (retracts to the inside of the case 20). Specifically, the operating unit 62 of the right latching member 60a and the operating unit 62 of the left latching member 60b are pinched by the index finger and the thumb, and both of them are pressed inward. Then, as shown in FIG. 5, the right latching member 60a moves in a left direction against pressing of the coil spring 65 at the back thereof, and the left latching member 60b moves in a right direction against pressing of the coil spring 65 at the back thereof. In other words, each of the right latching member 60a and the left latching member 60b moves to the inside of the case 20 to become close to each other. With this movement of the latching members 60, the protrusion length of the latching protrusion 61 from the case side surface 23 is decreased. Each latching member 60 can move in a right direction or a left direction until the operating units 62 abut on the inner surface of the inside of an opening part 64. That is, as shown in FIG. 5, when the operating units 62 of the right latching member 60a and the left latching member 60b each abut on the inner surface of the inside of the opening part 64, the protrusion length of each latching protrusion 61 from the case side surface 23 becomes the shortest, and the gap between the right latching member 60a and the left latching member 60b is minimized. When the protrusion length of the latching protrusion 61 from the case side surface 23 becomes the shortest, the latching protrusion 61 and the case side surface 23 become substantially flush with each other.

With reference to FIG. 2 and FIG. 3, a process of inserting/pulling-out of the communication module 1 into/from the electronic device will be described. First, a process of inserting the communication module 1 into the slot 9 for connection to the receptacle connector 4 will be described. The shown communication module 1 is inserted from above the sheets of FIG. 2 and FIG. 3 into the slot 9, and is connected to the receptacle connector 4 on the bottom of the slot 9. That is, a upside/downside direction (Y direction) on the sheets in FIG. 2 and FIG. 3 is an inserting/pulling-out direction of the plug connector 50 into/from the receptacle connector 4.

Into another slot 9 adjacent to the slit 9 to which the communication module 1 has been inserted, another communication module is inserted. Furthermore, into still another slot 9 adjacent to the slot 9 to which another communication module has been inserted, still another communication module is inserted. That is, the arranging direction of the communication module 1 shown in the drawings and other communication modules adjacent to this communication module is a forward/backward direction (Z direction) on the sheets in FIG. 2 and FIG. 3. This direction matches the arranging direction of the slots 9 and also the thickness direction of the communication module 1.

Here, in the course of insertion of the communication module 1 into the slot 9 as described above, the latching protrusion 61 of the right latching member 60a abuts on an upper part of the angle member 10a, and the latching protrusion 61 of the left latching member 60b abuts on an upper part of the angle member 10b. More specifically, the tilted part 61b (FIG. 4) of the latching protrusion 61 of the right latching member 60a abuts on the upper part of the angle member 10a, and the tilted part 61b (FIG. 4) of the latching protrusion 61 of the left latching member 60b abuts on the upper part of the angle member 10b. Then, insertion of the communication module 1 into the slot 9 is temporarily restricted.

However, when the communication module 1 is more strongly pressed downward, each latching member 60 moves to the inside of the case 20 against pressing of the coil spring 65 at the back thereof. In other words, each latching member 60 is pressed to the inside of the case 20, and the protrusion length of the latching protrusion 61 from the case side surface 23 is gradually decreased. At this time, the upper parts of the angle members 10a and 10b are each tilted along the tilted part 61b (FIG. 4) of the latching protrusion 61 so that each latching member 60 is smoothly moved to the inside of the case.

As the protrusion length of the latching protrusion 61 from the case side surface 23 is decreased, the communication module 1 is gradually inserted toward a deep part of the slot 9. Then, when the latching protrusion 61 moves backward to the position of the latching hole 13 with the insertion of the communication module 1 into the slot 9, each latching protrusion 61 to which the pressing of the coil spring 65 is applied protrudes again to the outside of the case 20 to enter the latching hole 13. That is, as shown in FIG. 3, the latching protrusion 61 is latched with the latching hole 13. Since the pressing of the coil spring 65 is continuously applied to the latching protrusion 61 latched with the latching hole 13 even after that, the state of the latching of the latching protrusion 61 with the latching hole 13 is maintained, and the communication module 1 cannot be pulled out from the slot 9.

Next, a process of disconnecting the receptacle connector 4 and the plug connector 50 and pulling out the communication module 1 from the slot 9 will be described. The operating unit 62 of the right latching member 60a and the operating unit 62 of the left latching member 60b shown in FIG. 3 are each operated toward the inside of the case 20. In other words, the operating units 62 are brought close to each other. Furthermore, in other words, the operating units 62 are brought close to the optical connecting unit 40. That is, a right/left direction (X direction) on the sheets in FIG. 2 and FIG. 3 is an operating direction of the operating units 62 in the present embodiment, and this direction is a direction orthogonal to both of the inserting/pulling-out direction (Y direction) of the plug connector 50 and the arranging direction (Z direction) of the communication module 1. Also, the operating direction of each operating unit 62 is a direction in parallel to the protruding direction of the latching protrusion 61 from the case 20.

The above-described operation of the operating units 62 is performed by pinching the pinching part 62d (FIG. 4) of the right latching member 60a and the pinching part 62d (FIG. 4) of the left latching member 60b by the index finger and the thumb. When each operating unit 62 is operated in the above-described operating direction, each latching member 60 moves to the inside of the case 20 against pressing of the coil spring 65. In other words, each latching member 60 is drawn into the case 20, and the protrusion length of the latching protrusion 61 from the case side surface 23 is gradually decreased.

When the protrusion length of each latching protrusion 61 from the case side surface 23 is decreased to a predetermined length or shorter, the latching protrusion 61 is detached from the latching hole 13. That is, the latching protrusion 61 is unlatched from the latching hole 13. Then, when the communication module 1 is pulled upward, the plug connector 50 is pulled out from the receptacle connector 4, so that the communication module 1 is pulled out from the slot 9.

As described above, the operating direction of each operating unit 62 included in the communication module 1 according to the present embodiment is orthogonal to the arranging direction (Z direction) of the communication module 1 and other communication modules adjacent thereto. Therefore, even if many communication modules are arranged in parallel to each other with a small pitch and the gap between the communication module 1 and other communication modules adjacent thereto is narrow, it is neither difficult nor impossible to access the operating units 62, and it is neither difficult nor impossible to ensure the operating amount (stroke) of the operating units 62.

Figure 6:
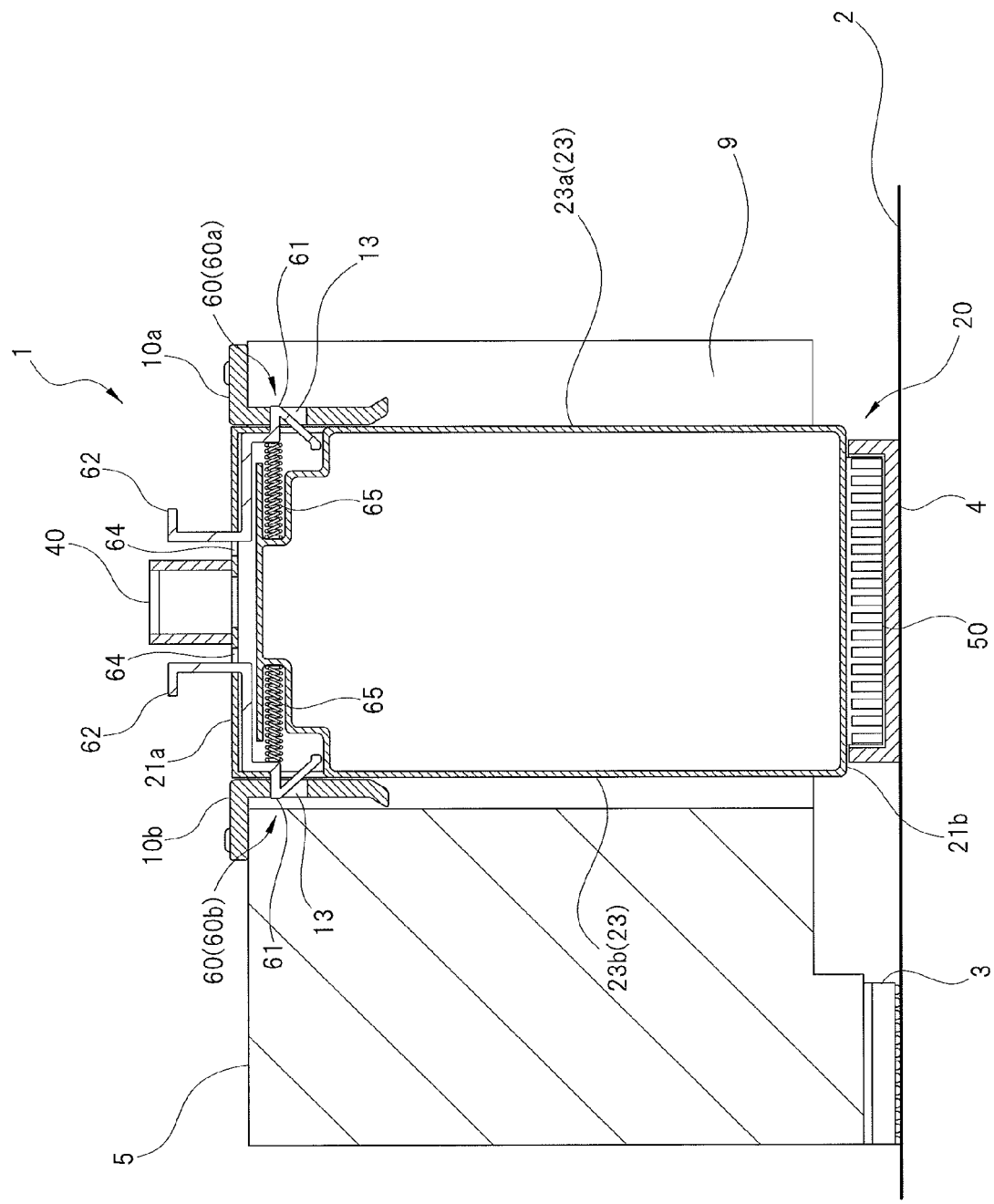
FIG. 6 is an enlarged cross-sectional view showing another example of the communication module to which the present invention is applied.

The present invention is not limited to the foregoing embodiment, and various modifications and alterations can be made within the scope of the present invention. For example, while the latching unit is provided outside the slot in the above-described embodiment, the latching unit may be provided inside the slot. For example, as shown in FIG. 6, the latching holes 13 may be arranged inside the slot 9 with turning the angle members 10a and 10b upside down. At this time, in order to avoid interference between the angle members 10a and 10b and the heat sink 5, a notch not shown is provided to the angle members 10a and 10b. Incidentally, an independent angle member may be arranged to each slot 9.

Figure 7:
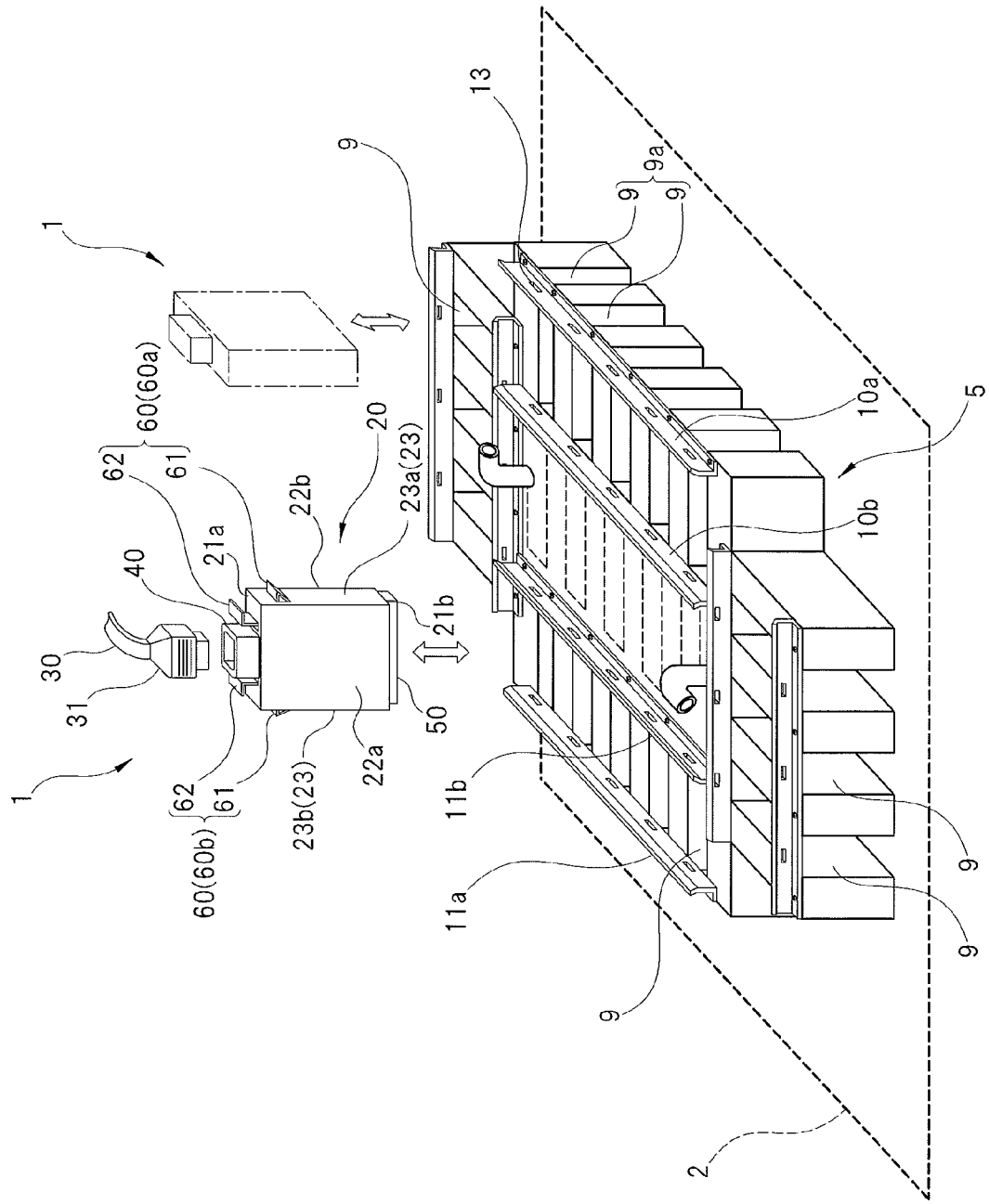
FIG. 7 is a perspective view showing another example of the structure of the electronic device having the communication module to which the present invention is applied which is mounted thereon.

Furthermore, as shown in FIG. 7, the invention has another embodiment in which slots 9 are formed in all sides of the heat sink 5, and the communication module 1 is inserted into each slot 9. Note that structures identical to the structures already described above are denoted by the same reference symbols in FIG. 7, and the repetitive description thereof is omitted. Still further, the invention has still another embodiment in which slots 9 are formed in three sides of the heat sink 5. Still further, the communication module may be inserted into only one/some of the slots included in the electronic device, and the remaining slots may be vacant slots. Incidentally, the invention has still another embodiment in which slots are made of a member different from that of the heat sink. Still further, slots are not indispensable constituent elements of the present invention. For example, the latching units may be provided on the substrate by mounting the angle members or others directly on the substrate. That is, the latching units may be directly provided on the substrate, or may be provided on any member (for example, the heat sink 5 in the above-described embodiment) mounted on the substrate.

The latching units are not necessarily through holes, and may be concave parts, convex parts, or grooves which the latching protrusions can be latched with and unlatched from. Also, the invention has still another embodiment in which the first connector provided on the motherboard is a plug connector and the second connector included in the communication module is a receptacle connector.

In place of the light-emitting element and the driving element, a light-receiving element and an amplifying element may be accommodated inside the case. Furthermore, in addition to the light-emitting element and the driving element, a light-receiving element and an amplifying element may be accommodated inside the case. Still further, the present invention can be applied to not only an optical communication module but also an electrical communication module. Even when the present invention is applied to an electrical communication module, operations and effects similar to those described above can be obtained. In the electrical communication module to which the present invention is applied, an electrical connecting unit is provided in place of the optical connecting unit 40 shown in FIG. 3 or others, and an electrical communication cable is connected to this electrical connecting unit. Also, various elements required for achieving an electrical communication function and other functions are accommodated inside the case.

What is claimed is:

1. A communication module mounted on a substrate together with a plurality of other communication modules, comprising:
    a case including a second connector which is inserted into/pulled out from a first connector provided on the substrate;
    a latching protrusion which has a variable protrusion length from the case and which can be latched with/unlatched from a latching unit provided on the substrate;
    an elastic member which presses the latching protrusion toward outside of the case so that a state of latching of the latching protrusion with the latching unit is maintained; and
    an operating unit which moves the latching protrusion toward inside of the case against pressing of the elastic member to unlatch the latching protrusion from the latching unit,
    wherein an operating direction of the operating unit is a direction orthogonal to both of an arranging direction of the communication module and other communication module adjacent to the communication module and an inserting/pulling-out direction of the first connector.

2. The communication module according to claim 1, further comprising
    a pair of the latching protrusions and a pair of the operating units,
    wherein, when the pair of operating units are brought close to each other along the operating direction, each of the pair of latching protrusions moves toward inside of the case along the operating direction.

3. The communication module according to claim 2,
    wherein the pair of operating units protrude from a top surface of the case which is opposite to a bottom surface of the case provided with the second connector, and
    one of the pair of latching protrusions moves inside/outside the case through an opening part formed in a first side surface of the case, and the other of the pair of latching protrusions moves inside/outside the case through an opening part formed in a second side surface of the case facing the first side surface.

4. The communication module according to claim 1,
    wherein the communication module is inserted into/pulled out from a slot provided on the substrate and included in the first connector, and
    the latching unit is provided in periphery of an opening part of the slot.

5. The communication module according to claim 4,
    wherein the slot is formed of a part of a heat sink mounted on the substrate, and
    the heat sink is overlapped and mounted on a communication semiconductor chip mounted on the substrate, and is thermally connected to the communication semiconductor chip.

6. A communication module mounted on a substrate together with a plurality of other communication modules, comprising:
    a case including a second connector which is inserted into/pulled out from a first connector provided on the substrate;
    a latching protrusion which has a variable protrusion length from the case and which can be latched with and unlatched from a latching unit provided on the substrate;
    an elastic member which presses the latching protrusion toward outside of the case so that a state of latching of the latching protrusion with the latching unit is maintained; and
    an operating unit which moves the latching protrusion toward inside of the case against pressing of the elastic member to unlatch the latching protrusion from the latching unit,
    wherein an operating direction of the operating unit is in parallel to a protrusion direction of the latching protrusion.

* * * * *